United States Patent
Hirota et al.

(10) Patent No.: US 8,114,244 B2
(45) Date of Patent: Feb. 14, 2012

(54) METHOD FOR ETCHING A SAMPLE

(75) Inventors: Kousa Hirota, Kokubunji (JP);
Yasuhiro Nishimori, Hikari (JP);
Hiroshige Uchida, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 407 days.

(21) Appl. No.: 12/396,673

(22) Filed: Mar. 3, 2009

(65) Prior Publication Data

US 2010/0159704 A1 Jun. 24, 2010

(30) Foreign Application Priority Data

Dec. 24, 2008 (JP) ................................. 2008-328510

(51) Int. Cl.
*G06F 19/00* (2011.01)

(52) U.S. Cl. ...................... 156/345.27; 700/121; 134/1.1

(58) Field of Classification Search .................. 700/121; 156/345.1, 345.13, 345.16, 345.24, 345.25, 156/345.27; 134/1.1

See application file for complete search history.

(56) References Cited

U.S. PATENT DOCUMENTS

| | | | | |
|---|---|---|---|---|
| 5,376,223 A * | 12/1994 | Salimian et al. | ............... | 438/694 |
| 6,939,435 B1 * | 9/2005 | Tanaka et al. | ............ | 156/345.35 |
| 7,862,736 B2 * | 1/2011 | Nakayama | ........................ | 216/60 |
| 7,887,637 B2 * | 2/2011 | Ozaki et al. | ..................... | 134/1.1 |
| 2002/0192972 A1 * | 12/2002 | Narita et al. | ................... | 438/710 |
| 2005/0284574 A1 * | 12/2005 | Tanaka et al. | ............. | 156/345.33 |
| 2008/0223522 A1 | 9/2008 | Kobayashi et al. | | |
| 2008/0236614 A1 * | 10/2008 | Yakushiji et al. | .............. | 134/1.1 |
| 2008/0237184 A1 * | 10/2008 | Yakushiji et al. | ............... | 216/67 |

FOREIGN PATENT DOCUMENTS

| | | |
|---|---|---|
| JP | 2003-518328 | 6/2003 |
| JP | 2005-244065 | 9/2005 |
| JP | 2008-235337 | 10/2008 |
| WO | WO 01/46490 A1 | 6/2001 |

* cited by examiner

*Primary Examiner* — Michael D Masinick

(74) *Attorney, Agent, or Firm* — Antonelli, Terry, Stout & Kraus, LLP.

(57) ABSTRACT

The invention provides a method for performing mass production processing of etching a sample capable of maintaining a stable processing profile. The method for performing mass production processing of etching for subjecting a wafer carried into a vacuum processing reactor to plasma processing uses an apparatus comprising a vacuum processing chamber, a gas supply apparatus, a plasma generating means for generating plasma, an emission spectroscope for monitoring the plasma emission, and a device for storing the emission spectrum, wherein a non-operating time of the apparatus (idling SS) occurs in which the mass production processing of the wafer is temporarily stopped, wherein during cleaning steps S2 and S2' before and after idling SS, emission intensities SiF(1) and SiF(2) in the plasma including the information on the state of deposition of reaction products and the temperature on the uppermost surface of the reactor are monitored, and a database S4 is referred to based on these emission spectrums, so that the time of the plasma heating step S3 after the idling SS is controlled to heat the reactor, and after performing plasma heating S3, the next sample is subjected to etching S2.

8 Claims, 15 Drawing Sheets

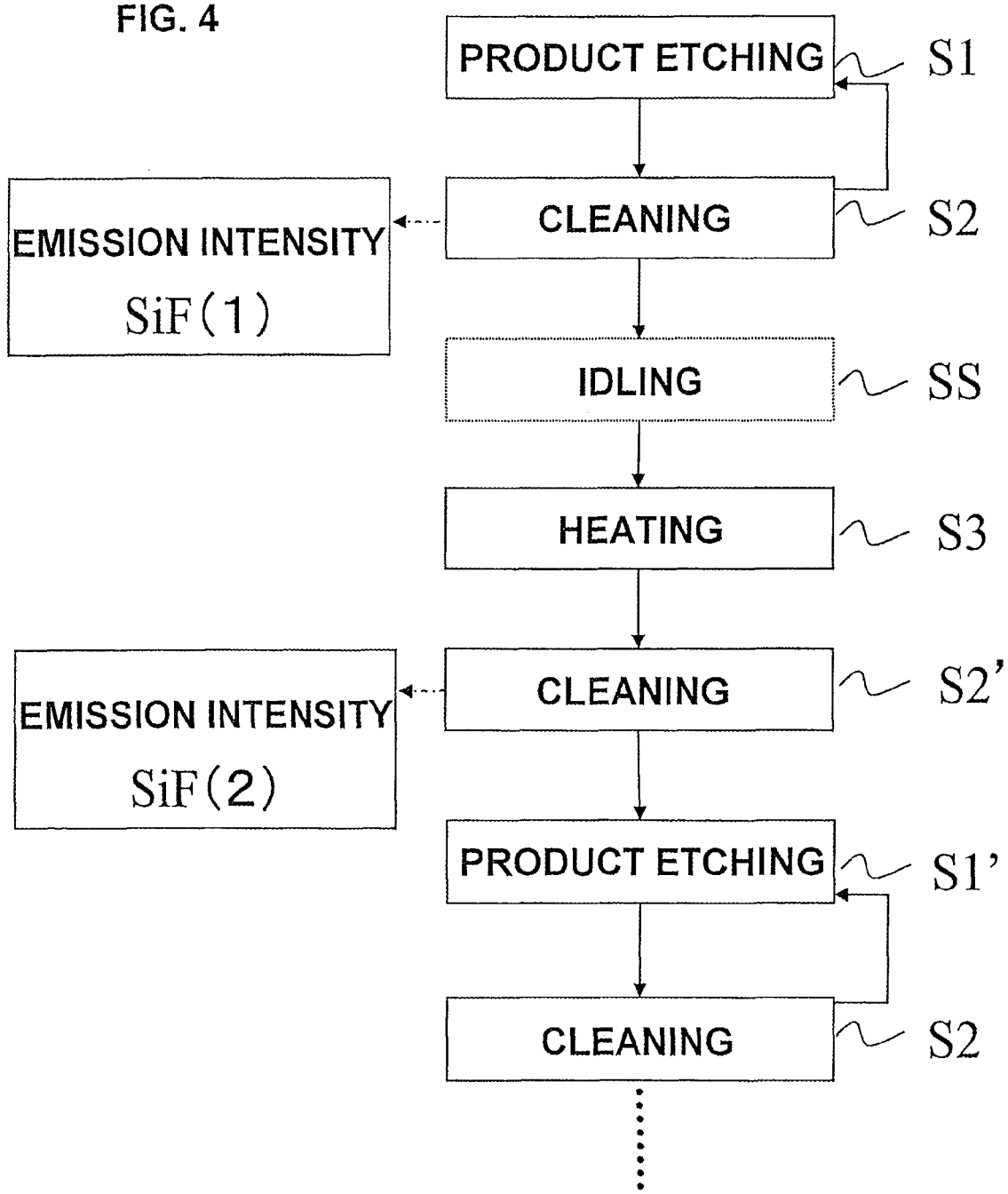

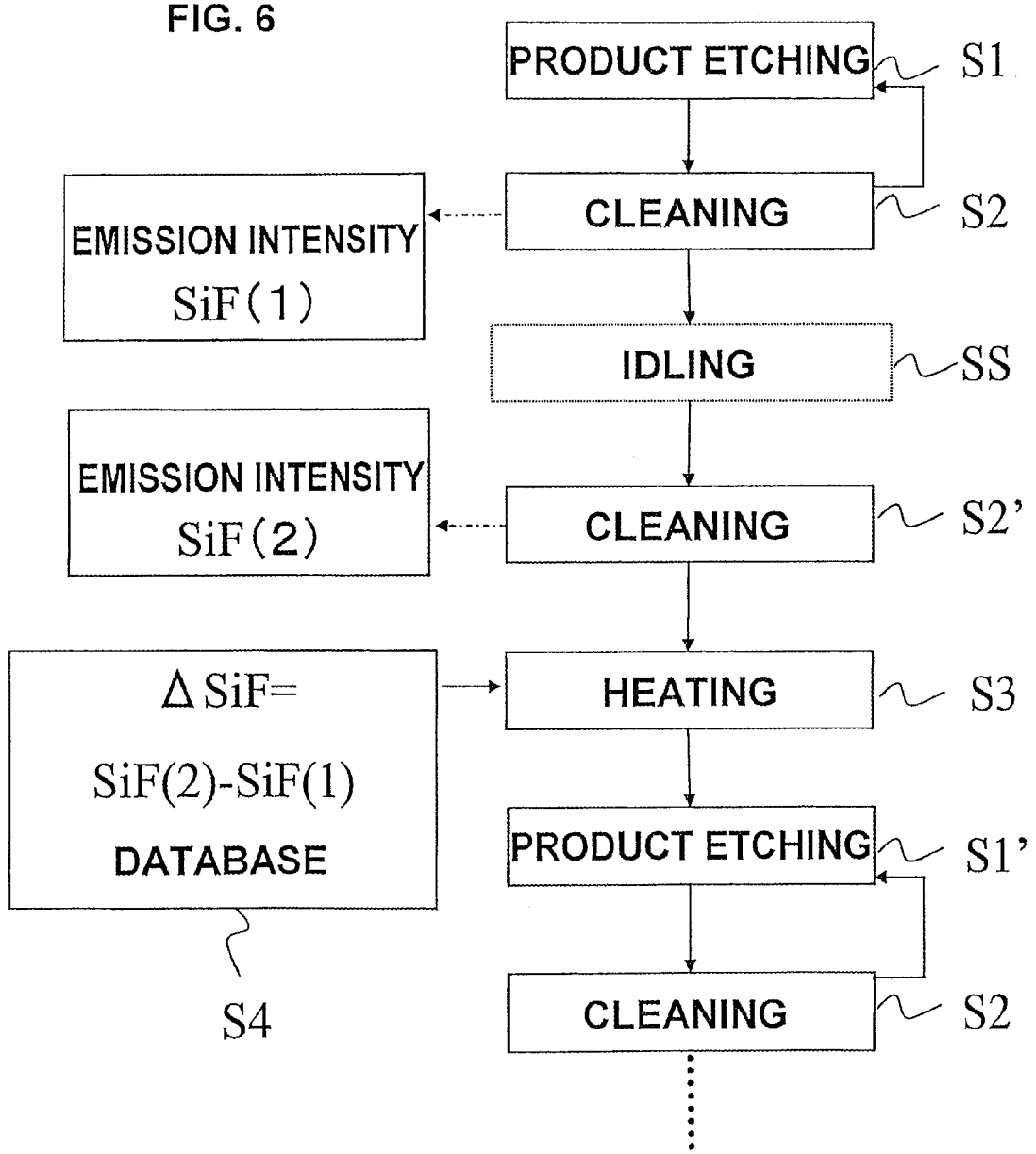

METHOD FOR ETCHING A SAMPLE

The present application is based on and claims priority of Japanese patent application No. 2008-328510 filed on Dec. 24, 2008, the entire contents of which are hereby incorporated by reference.

BACKGROUND OF THE INVENTION

1. Field of the Invention

The present invention relates to a method for manufacturing semiconductor devices including MOS (metal oxide semiconductor) transistor using electrons or holes as carrier, and especially, relates to a method for etching a sample, capable of performing etching with stabilized processing profile even after the occurrence of an idling in which mass production etching process is temporarily discontinued.

2. Description of the Related Art

Along with the recent improvement in integration and speed of semiconductor integrated circuits, there are demands to further enhance the miniaturization of gate electrodes. However, since a slight change in the dimension of gate electrodes causes the source/drain current and the leak current during stand-by to be varied greatly, it is extremely important to stabilize the accuracy of dimension (CD: critical dimension) of gate electrodes and to stabilize the processing profile thereof.

The change of radical status in the plasma within the etching reactor that affects the processing profile is mainly caused by the following two causes.

The first cause is the physical adhesion of reaction products on the uppermost surface of the reactor or the chemical change of the uppermost surface of the reactor through etching. In that case, even if plasma is generated via the same conditions, the consumption quantity of radicals and the recombination probability of radicals on the uppermost surface of the reactor are changed, and thus, the radical density in the plasma is changed.

The second cause is the change in the uppermost surface temperature of the reactor material. In that case, since the adsorption coefficient and the reaction speed of etching radicals, depositing radicals and reaction products on the uppermost surface of the reactor vary, the speed in which the uppermost surface of the reactor material is etched and the deposition speed thereof are varied. As a result, the balance of radicals and reaction products being consumed in the uppermost surface of the reactor is changed, and thus, the radical density in the plasma is changed.

In other words, in order to maintain a stable processing profile, it is important to (1) maintain a constant physicochemical status of the uppermost surface of the reactor, and (2) maintain a constant uppermost surface temperature of the reactor material. However, in the field of actual semiconductor mass production using etching apparatuses, there are cases where the physicochemical state of the uppermost surface of the reactor is changed, and mass production processing is temporarily discontinued.

In the prior art, with respect to the above-mentioned cause (1), the physicochemical status of the uppermost surface of the reactor is maintained for example by removing reaction products via cleaning or by coating the surface using carbon-based deposition gases. Published Japanese translation of PCT international publication No. 2003-518328 (patent document 1) discloses performing in-situ cleaning of reaction products, and then depositing a carbon-based coating so as to stabilize the processing profile.

With respect to the above-mentioned cause (2), Japanese patent application laid-open publication No. 2005-244065 (patent document 2) discloses a method for maintaining the temperature of the uppermost surface of the reactor by generating plasma using a processing condition set in advance based on plasma processing history so as to control the uppermost surface temperature of the reactor and stabilize the processing profile.

According to the apparatus disclosed in patent document 1, it is possible to remove the reaction products deposited in the processing chamber, but with respect to the second cause (2), it is not possible to stabilize the processing profile. Further, the apparatus disclosed in patent document 2 is capable of coping with the above-mentioned causes (1) and (2), but it is necessary to either attach a temperature measuring device to the apparatus before starting mass production to measure the temperature off-line, or perform simulation. The attachment of a temperature measuring device cannot be performed easily, since not only is it time-consuming to attach the device, but it may also cause metal contamination and generate particles. Further, according to heating techniques referring to an off-line temperature database or to temperature prediction via simulation, the data regarding the uppermost surface of the reactor is not monitored in real time, so there is a limit in the accuracy of reproduction of the processing profile after idling. In other words, the disclosure of patent document 2 offers only limited response to causes (1) and (2).

SUMMARY OF THE INVENTION

The present invention aims at solving the problems of the prior art by providing a method for etching a sample via mass production processing, capable of maintaining a stable processing profile of the mass production semiconductor devices.

In order to solve the problems of the prior art, the present invention provides a method for etching a sample via mass production processing using an etching apparatus comprising a vacuum processing reactor constituting a vacuum processing chamber, a gas supply device for supplying processing gas into the vacuum processing reactor, a plasma generating means for supplying electromagnetic energy into the vacuum processing chamber and dissociating the processing gas supplied into the processing chamber to generate plasma, an emission spectroscope for monitoring the emission of plasma generated via the plasma generating means, and a means for storing the emission spectrum thereof, wherein the emission within the plasma including the information on the state of deposition of reaction products and temperature of the uppermost surface of the reactor is monitored, and based on the emission, the time of the heating step after idling for heating the reactor is determined, or the end of the repeatedly performed cleaning step and heating step is determined, or the end of the heating and cleaning step is determined.

BRIEF DESCRIPTION OF THE DRAWINGS

FIG. 4 is a flowchart illustrating the process for computing the relationship between $\Delta CD$ and heating time;

FIG. 6 is a flowchart illustrating the process of embodiment 1 of the present invention applied to mass production processing;

DETAILED DESCRIPTION OF THE PREFERRED EMBODIMENTS

Embodiment 1

Figure 1:
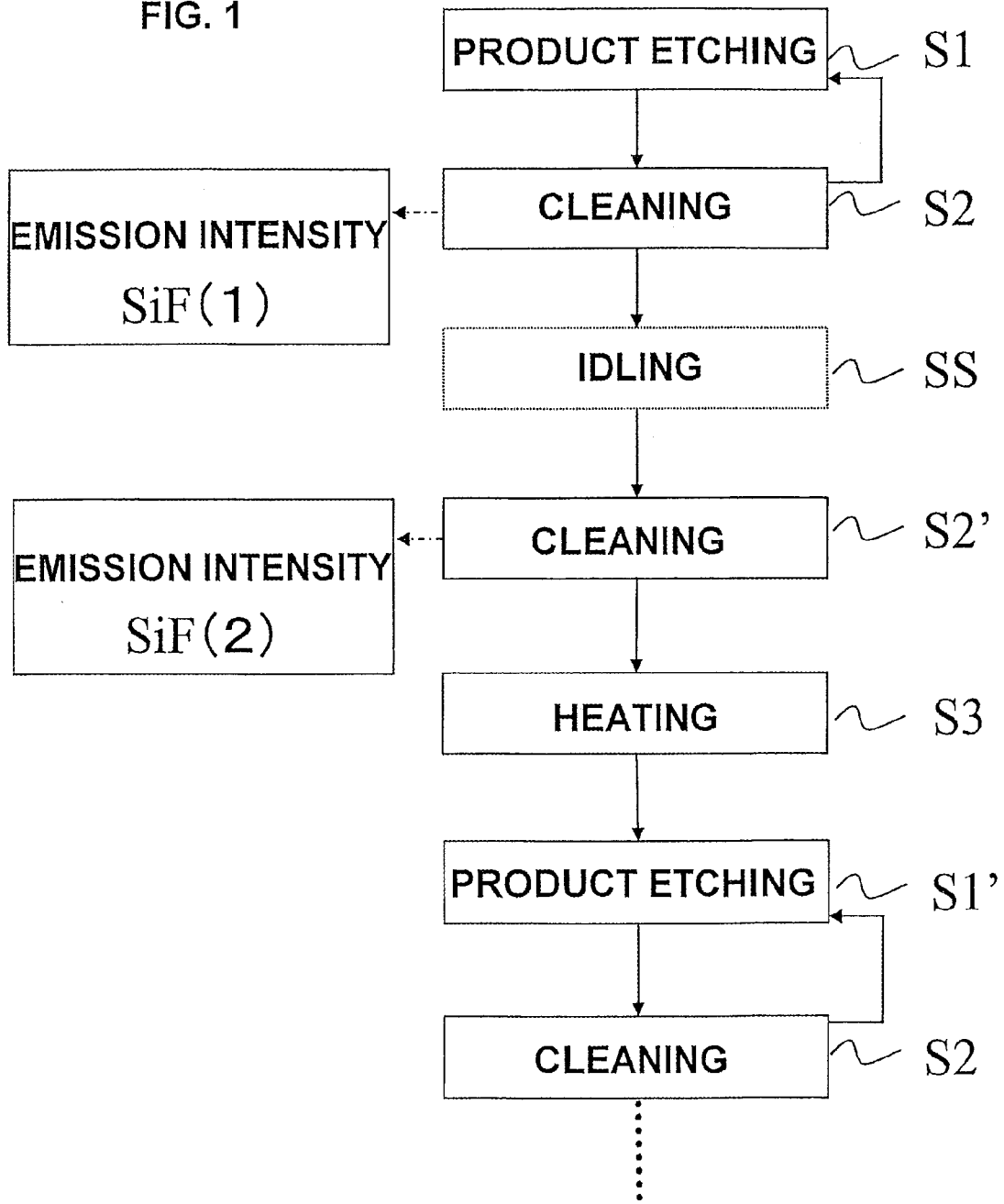
FIG. 1 is a flowchart illustrating a process acting as a previous step for determining the time of a heating step performed after idling, based on the emission intensity during cleaning performed before and after the idling according to a first preferred embodiment of the present invention.

Now, with reference to the flowchart of FIG. 1, we will describe a method related to a first preferred embodiment of the present invention for determining the time of a heating process to be performed after idling based on the emission intensity obtained during the cleaning step for cleaning a wall surface of a vacuum processing chamber before and after idling.

In embodiment 1, the starting point of description is a state where the reactor wall surface has been sufficiently heated through repeated mass production etching process using plasma. From that point, mass production operation is continued to perform product etching (S1). Next, a cleaning step using plasma is performed per processing of a single wafer to remove the reaction products attached to the wall surface of the reactor during product etching (S2). In mass production processing, the product etching step (S1) and the plasma cleaning step for cleaning the reactor surface (S2) is repeatedly performed. In the plasma cleaning step (S2), it does not matter whether dummy wafers are used or not (the cleaning can be performed in waferless manner), but it is preferable that the gas introduced to the reactor during the plasma cleaning step (S2) includes F-based gas ($CF_4$, $SF_6$, $C_4F_8$, $CHF_3$, $C_4F_6$, $NF_3$). Reasons are described later.

After performing the plasma cleaning step (S2) for cleaning the reactor surface, if mass production processing is temporarily discontinued to create an idling state (SS) for maintenance of the apparatus or other reasons, no more transmission of heat from heated ions and radicals in the plasma to the reactor wall surface will occur, so the temperature of the reactor wall surface drops as the idling time becomes longer.

Next, we will describe the steps for restarting the mass production processing after ending idling (SS). Prior to performing product etching, a plasma cleaning step (S2') of the reactor wall surface is performed. The object of this step is to remove the uppermost surface layer of the reactor wall surface having been subjected to physicochemical reaction caused by the drop of temperature of the uppermost surface of the reactor wall during idling and by the wall surface being left in an environment different from that during etching for a long time. After the cleaning step (S2'), plasma is generated to heat the reactor (S3) so as to increase the uppermost surface temperature of the reactor wall surface having dropped during idling. This step is called a plasma heating step, and immediately thereafter, the product etching process (S1') is started again, and the mass production processing is continued where the plasma cleaning step (S2) of the reactor wall surface followed by the product etching process (S1') are repeatedly performed.

Figure 2:
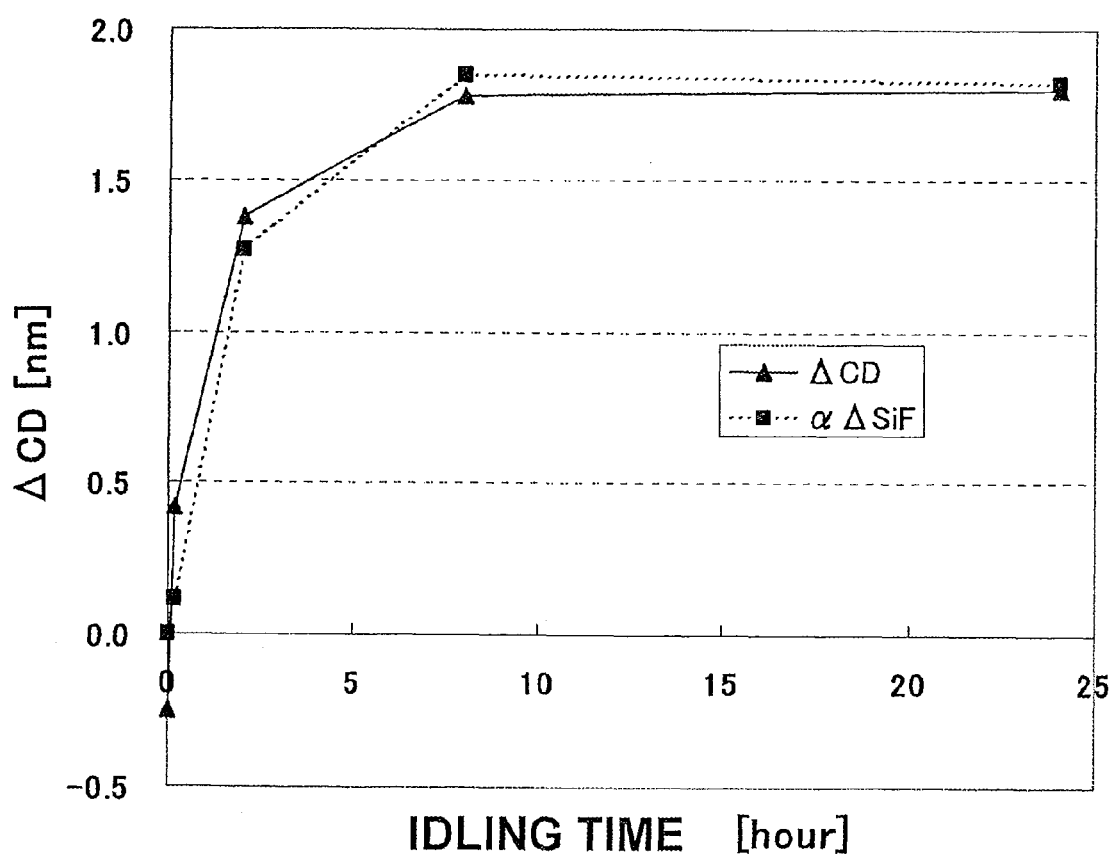
FIG. 2 is a graph showing the idling time dependency with respect to ΔCD=(CD during product etching S1')−(CD during product etching S1) in FIG. 1.

FIG. 2 shows an idling time dependency graph with respect to $\Delta CD$, that is, (CD during product etching S1')−(CD during product etching S1) when the heating time of the plasma heating step (S3) in the flowchart of FIG. 1 is zero. The CD was measured after performing etching using CD-SEM (critical dimension-scanning electron microscope). The average value of measuring the same line of 167 points within the plane of a 300 mm wafer is shown. It can be seen that according to this product, the CD after idling becomes greater than the CD before idling as the idling time increases.

Further, the value obtained by subtracting the emission intensity of SiF in the cleaning step S2 before idling (SiF(1) in FIG. 1) from the emission intensity of SiF during the cleaning step (S2') after idling (SiF(2) in FIG. 1) is defined as $\Delta SiF = SiF(2) - SiF(1)$, and the dependency of idling time with respect to $\alpha\Delta SiF$ having multiplied a certain coefficient $\alpha$ to the above-defined value is also shown in FIG. 2. In the present example, the wavelength of SiF is 440 nm. It can be recognized from this graph that the value of $\alpha\Delta SiF$ increases as the idling time increases. Further, the value of $\Delta CD$ corresponds highly with $\alpha\Delta SiF$.

In the experiment of embodiment 1, the value of $\alpha$ was negative. The emission source of SiF was the reaction products of cleaning gas containing F and the quartz components (such as shower plate, quartz inner cylinder and susceptor) used as reactor wall surface material. In general, the etching speed of quartz components increases as the temperature of the quartz components rises, so the value of $\Delta SiF$ varies together with the temperature difference of the uppermost surface of the reactor. Further, if the surface of the quartz component is covered with a substance other than quartz that cannot be cleaned, the reaction area with F is reduced, so the emission intensity of SiF is reduced in correspondence with that quantity. In other words, the emission intensity of SiF simultaneously includes the exposed area on the uppermost surface of quartz components, so that ΔSiF can be considered as an indicator showing quantitatively the reactor environment having the reactor temperature difference and difference of exposed area of quartz components as functions. Therefore, the control of ΔSiF leads to the control of difference of radical status in the reactor during etching (reactor environment), and in other words, it becomes possible to control the CD of product etching. From the above-described features, it is recognized that the method using ΔSiF as indicator is ideal for minimizing the CD difference before and after idling.

Figure 3A:
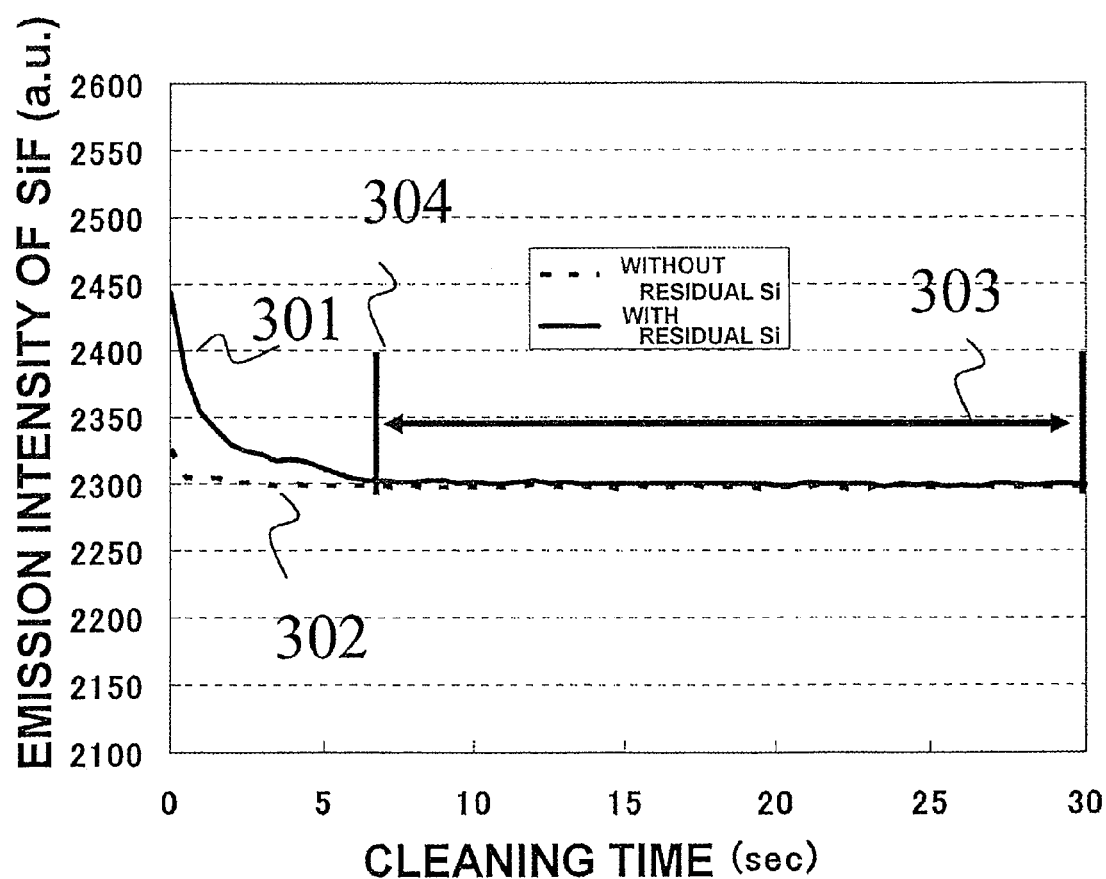
FIG. 3A is a graph illustrating the time variation of emission intensity of SiF during the cleaning step immediately after etching a product wafer.

Now, we will describe a preferable data extraction method for extracting the SiF emission intensity during the plasma cleaning step (S2 or S2') and the method for ending the cleaning step. FIG. 3A illustrates an example of the time variation of SiF emission intensity during the cleaning step immediately after etching a product wafer. As a typical example, a cleaning waveform 301 when Si resides in the reactor and a cleaning waveform 302 when Si does not reside therein are shown. In this example, the cleaning waveform when residual Si exists varies for approximately 7 seconds, and thereafter, the emission intensity corresponds to the time variation of the case where no residual Si exists. In other words, since the emission intensity prior to 7 seconds includes the change in emission intensity corresponding to the amount of residual Si in the reactor, it is preferable to apply as the value of SiF(1) and SiF(2) the emission intensity 303 during 7 through 30 seconds where the emission intensity of SiF does not show any time variation. The above example refers to the case where no residual deposits other than Si-based deposits remain in the reactor. In the above case, the cleaning step can be ended at point 304 of 7 seconds.

Figure 3B:
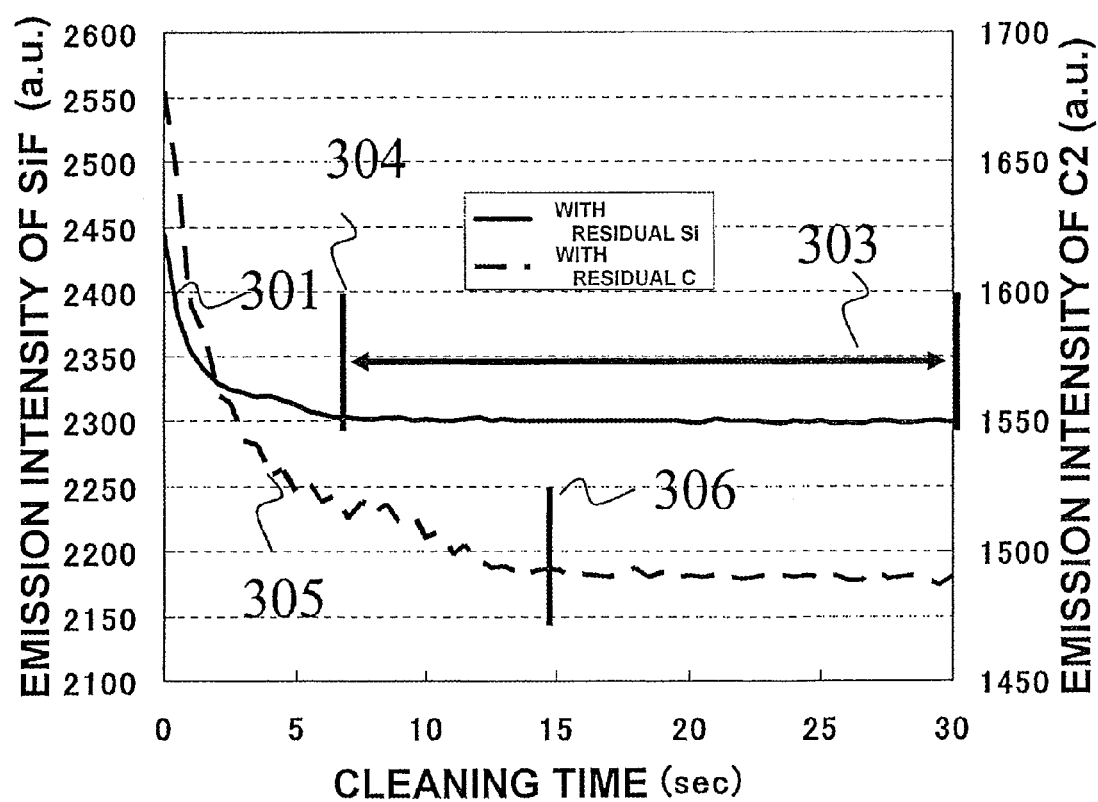
FIG. 3B is a graph illustrating the time variation of emission intensity of SiF and $C_2$ during the cleaning step performed immediately after etching a product wafer in which C-based residual deposits tend to remain.

FIG. 3B differs from FIG. 3A in that it shows an example of time variation of emission intensity of SiF and $C_2$ during the cleaning step immediately after etching a product wafer in which C-based residual deposits tend to remain. In the example, the waveform of $C_2$ varies to point 306 of approximately 15 seconds, and thereafter, the emission intensity has small time variation and can be considered as a constant value. Thus, if residual deposits other than Si-based deposits exist, the cleaning step can be ended at point 306 of 15 sec. However, even in such example, the emission intensity 303 from 7 sec to 15 sec can be applied as the value of emission intensity SiF(1) or emission intensity SiF(2). Further, if the cleaning is performed in a time-fixed manner of 30 seconds, the emission intensity 303 from 7 sec to 30 sec can be applied as the value of emission intensity SiF(1) or emission intensity SiF(2).

Figure 5:
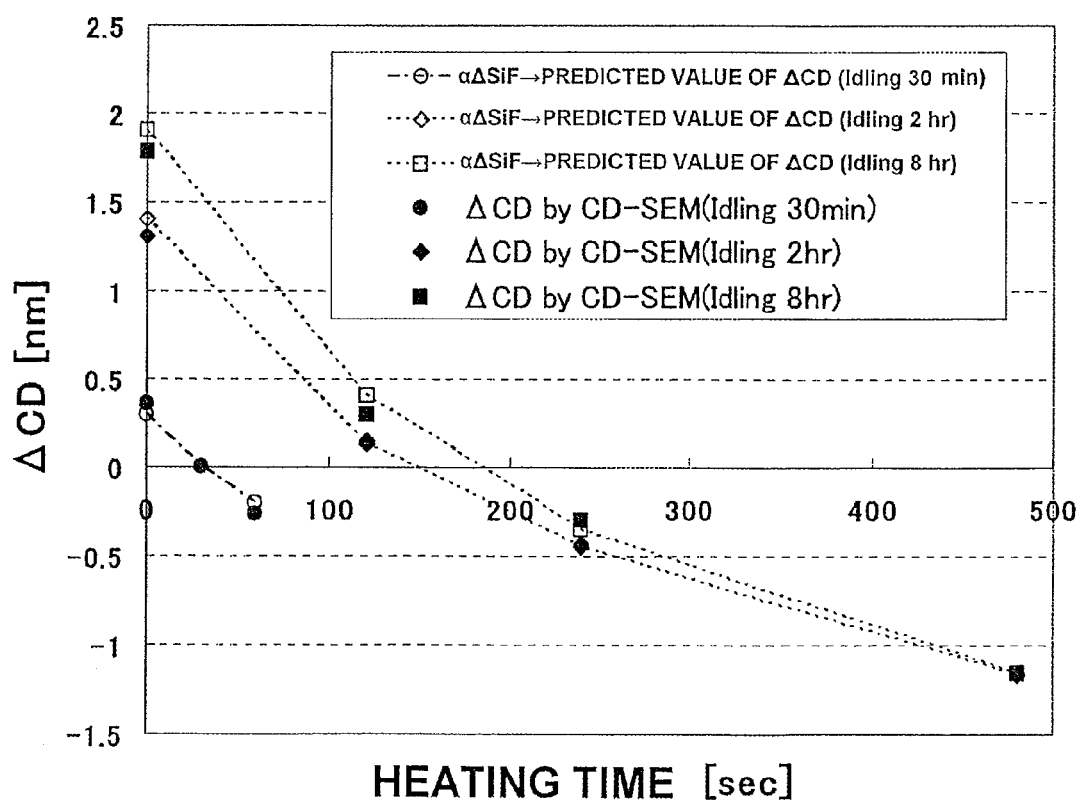
FIG. 5 is a graph illustrating the experimental results for obtaining the heating time dependency of $\alpha\Delta SiF$ by using the flowchart of FIG. 3 and setting the conditions of the heating step to 100 cc Ar flow rate, 0.5 Pa pressure, 1000 W microwave power and 0 W wafer bias, and using previously computed $\alpha$.

FIG. 4 is a flowchart for obtaining the relationship between idling time and heating time, aimed at obtaining the acceptable value of ΔCD. The flowchart of FIG. 4 differs from that of FIG. 1 in that the order of plasma cleaning of the reactor wall surface (S2') and the plasma heating of the reactor wall surface (S3) after idling (SS) is altered. FIG. 5 is a graph illustrating the experimental results of acquiring the heating time dependency of αΔSiF using α obtained in FIG. 2 using the flowchart of FIG. 4, with the conditions of plasma heating process set as follows: 100 cc Ar flow rate, 0.5 Pa pressure, 1000 W microwave power and 0 W wafer bias. The actual measured value of ΔCD using CDSEM is shown via a solid line (black circle, black triangle and black square) plot, and the αΔSiF computed from the emission is shown via a dotted line (white circle, white triangle and white square) plot. Further, data was acquired with the idling (SS) time set to 30 minutes, 2 hours and 8 hours, respectively. Ar was selected as the gas condition of the heating step because (1) it is an inert gas that does not cause corrosion of the components within the reactor, and (2) it was found, through examination of the heating efficiency of general gas species used for etching, that Ar had good heating efficiency.

Based on the above results, it was discovered that regardless of idling time, the ΔCD and the predicted ΔCD were both reduced as the heating time increased. Further, it was discovered that the ΔCD substantially became zero when heating was performed for approximately 130 seconds when idling was performed for two hours, approximately 180 seconds when idling was performed for eight hours, and approximately 30 seconds when idling was performed for 30 minutes. Generally, as the idling time increased, the absolute value of αΔSiF was increased, and simultaneously, the heating time required for the ΔCD to become approximately zero is also increased. Further, in the present experiment, αΔSiF corresponded well with ΔCD, confirming that αΔSiF is a good indicator for CD control. What we should focus on here is that through use of this graph, it is possible to refer to the necessary heating time based on the αΔSiF when the heating time is zero. Therefore, by acquiring the idling time dependency of heating time and αΔSiF and storing the same in a database in advance, it is possible to refer to the necessary heating time based on the αΔSiF when the heating time is zero, and to minimize the CD difference before and after the idling.

Figure 7A:
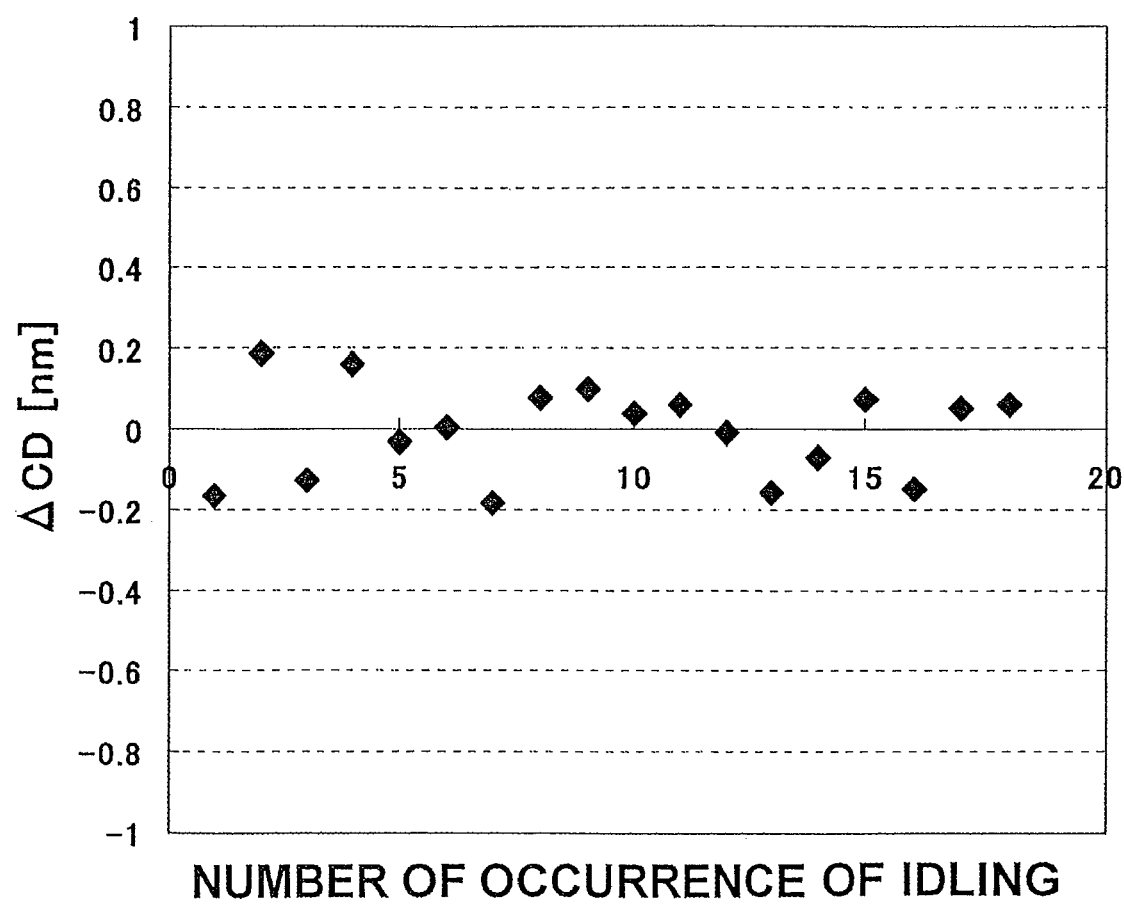
FIG. 7A is a graph illustrating the relationship between the number of occurrence of idling and the $\Delta CD$ at that time when idling has occurred for one minute or longer and at longest the idling occurred for three days due to apparatus failure, when the process according to the flowchart of FIG. 6 was applied to mass production processing.

The flow of the process of the present invention applied to mass production operation will now be described with reference to the flowchart of FIG. 6. According to the flowchart of FIG. 6, a database (S4) portion storing the relationship between αΔSiF and heating time (for example, FIG. 5) is added to the flowchart of FIG. 1. FIG. 7 is a graph showing the relationship between the number of occurrence of idling and the ΔCD at that time, wherein the idling occurs for over one minute, and at longest the idling occurs for three minutes due to apparatus failure, when mass production operation is performed using the flowchart of FIG. 6. As a result, it was discovered that by adopting the present method, the processing can be operated with the ΔCD falling within the range of plus or minus 0.2 nm even when idling occurs. In other words, by performing plasma cleaning of the reactor wall surface (S2') after idling (S2), then performing plasma heating of the reactor wall surface (S3) for a heating time where ΔSiF=SiF(2)−SiF(1) substantially becomes zero, and then transiting to product etching (S1'), the ΔCD can be set to fall within the range of plus or minus 0.2 nm even when idling occurs for a long period of time.

Figure 7B:
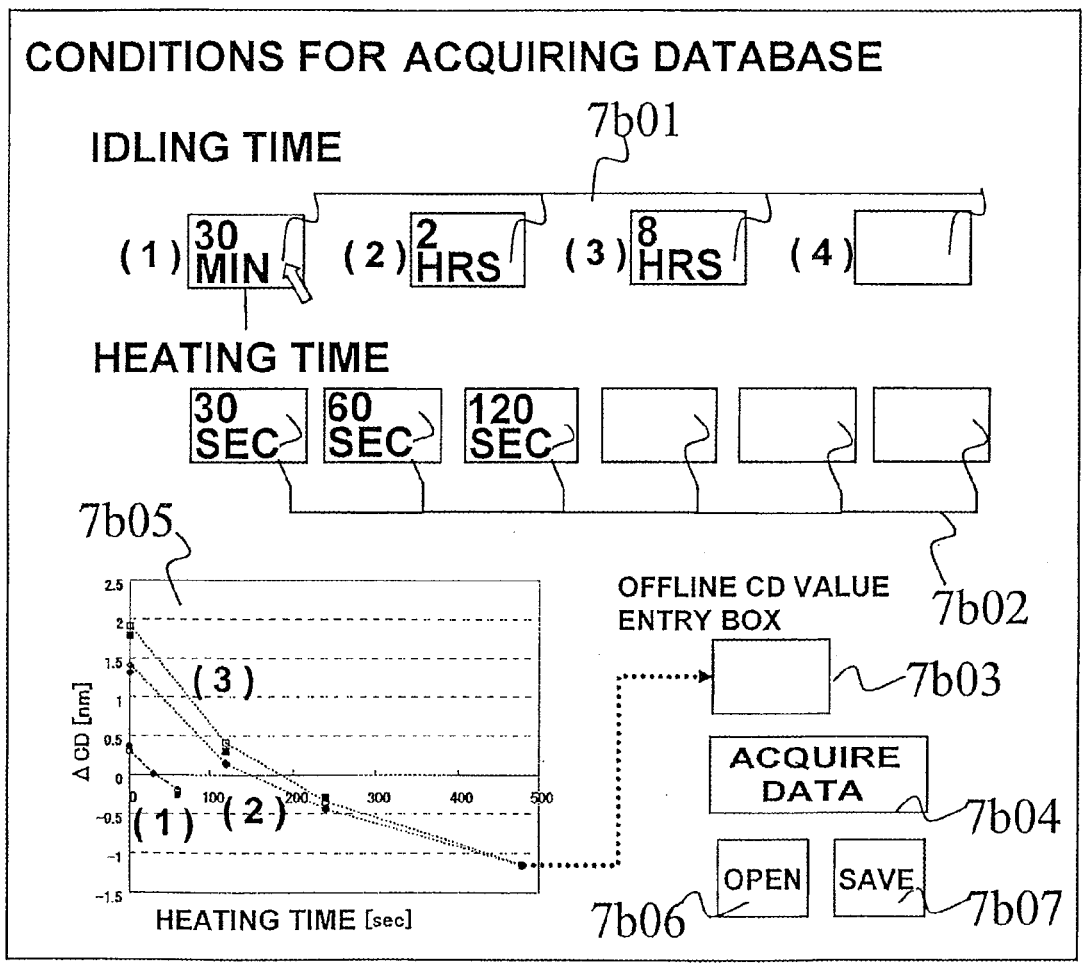
FIG. 7B is a view illustrating the user interface on the personal computer for facilitating the construction of database.

Now, we will describe a method for constructing a preferable database. FIG. 7B is an example of the user interface on the personal computer for facilitating the construction of database. On the upper portion of the screen are entry setup boxes 7b01 of idling time for acquiring the ΔCD. The preferred idling time is entered to items (1), (2), (3), (4) and so on in order. The number of items can be increased according to circumstances. As for the idling time lastly selected via a mouse, entry setup boxes 7b02 of the heating time to be acquired can be set. After setting these boxes, etching is started by placing the product wafer and the dummy wafer in the processing apparatus and clicking an "acquire data" button 7b04. The product wafer having been etched is measured using a CD-SEM or an OCD (optical critical dimension), and the measured value is transferred via a network to the etching apparatus. The result is shown in a relationship graph 7b05 of ΔCD and heating time per idling time. If the etching apparatus and the CD measurement device are not connected via a network, it is possible to enter the value in an offline CD value entry box 7b03. Further, the acquired data can be saved 7b07 and opened 7b06. Thus, it becomes possible to respectively manage the target products.

Figure 8:
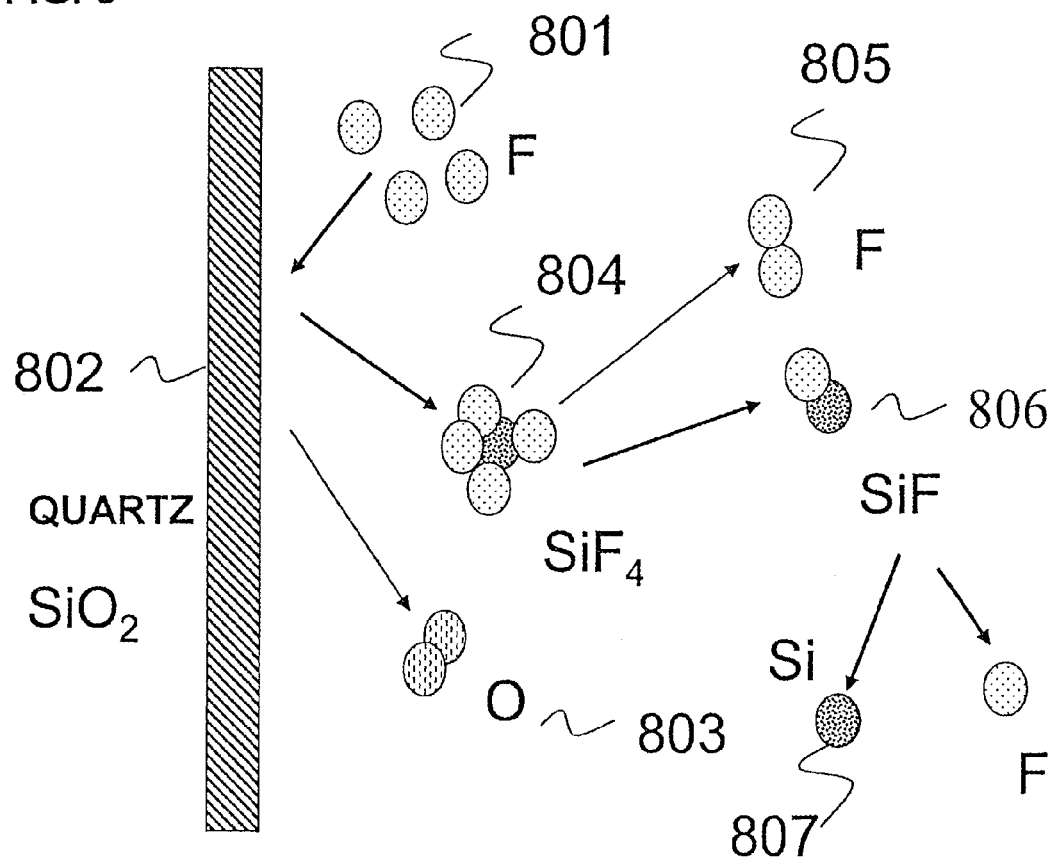
FIG. 8 is a frame format illustrating the reaction process of dissociated F 801 and quartz ($SiO_2$) 802 when F-based gas is introduced as cleaning gas.

In embodiment 1, a heating time where the difference in emission intensity ΔSiF before and after idling is substantially zero was obtained, but instead of ΔSiF, a heating time where the ratio of emission intensity before and after idling (SiF(2)/SiF(1)) substantially equals one can be obtained. Further, the present embodiment utilizes SiF as the emission species before and after idling, but it is possible to use other emission species. For example, FIG. 8 is a frame format illustrating the introduction of F-based gas as introduced gas for the cleaning process, and the reaction process of the dissociated fluorine (F) 801 and the quartz ($SiO_2$) 802 used in the reactor members. At first, oxygen (O) 803 is generated by the reaction process of quartz 802 and F 801. Next, the reaction product ($SiF_4$) 804 of F 801 and quartz 802 is re-dissociated to generate F 805 and SiF 806. Finally, SiF 806 is re-dissociated to generate Si 807 and F. In other words, by using these emission species, the ΔCD can be controlled in a similar manner as using ΔSiF. When $CF_4$, $CHF_3$ or $C_4F_8$ is contained in the introduced gas for the cleaning step, it is also possible to use $C_2$ as the emission species.

Similarly, SiCl, O, Cl, Si or H can be used as emission species by using Cl-based gas such as HCl and $Cl_2$ for cleaning.

As described, according to embodiment 1, in order to minimize the ΔCD before and after idling, the relationship between the heating time where αΔSiF approximately equals zero is acquired in advance to form a database, based on which the CD after idling can be stabilized.

Further, embodiment 1 enables to provide a method for etching a sample capable of monitoring the information on the uppermost surface of the reactor in real time, and to maintain a stable processing profile after idling.

Embodiment 2

A method for determining the end point of the heating step after idling based on the emission intensity obtained during the cleaning process without using a database according to embodiment 2 of the present invention will now be described with reference to the flowchart of FIG. 9. In embodiment 2, the database (S4) section shown in FIG. 6 of embodiment 1 is omitted, and instead, a determination control section (S5) of ΔSiF=0 is additionally provided.

The process is the same as embodiment 1 to the point where plasma cleaning (S2') is performed immediately after idling (SS), and the emission SiF(2) of the plasma cleaning after idling is utilized to repeatedly perform the heating step (S3) and the plasma cleaning step (S2') until ΔSiF=SiF(2)−SiF(1) substantially equals zero (S5). However, the plasma cleaning step repeatedly performed after the heating step (S3) has an effect to accelerate the consumption of components within the reactor, so by taking this point into consideration, it is preferable that the plasma cleaning step is performed for a short time, such as from 1 to 60 seconds. However, a sufficient operation time is required to at least remove the Si residue within the reactor so that the emission intensity of SiF no longer shows any change, as described in embodiment 1.

Figure 9:
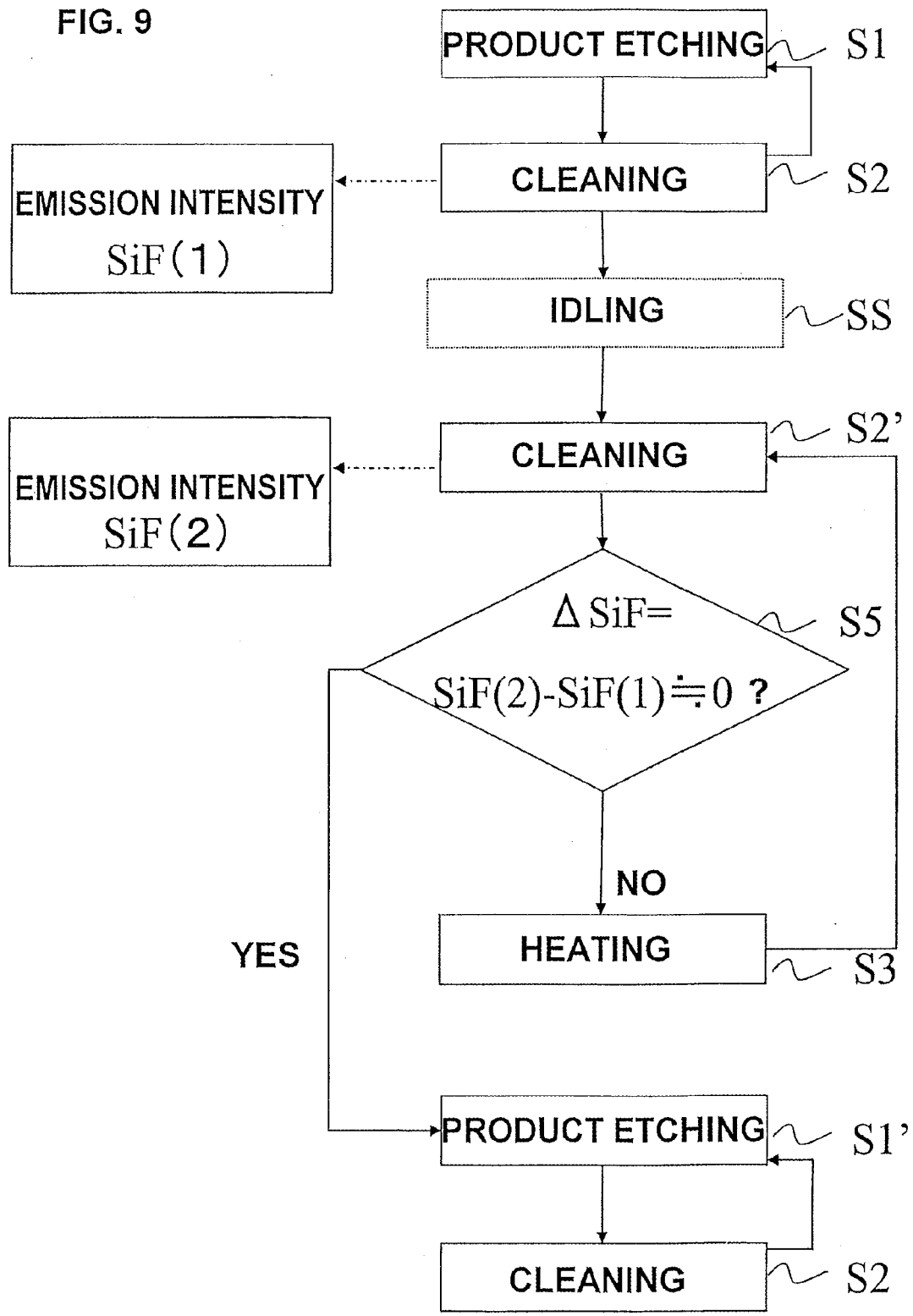
FIG. 9 is a flowchart describing the process for determining the end point of the heating step after performing idling based on the emission intensity during cleaning without referring to a database according to embodiment 2 of the present invention.
Figure 10:
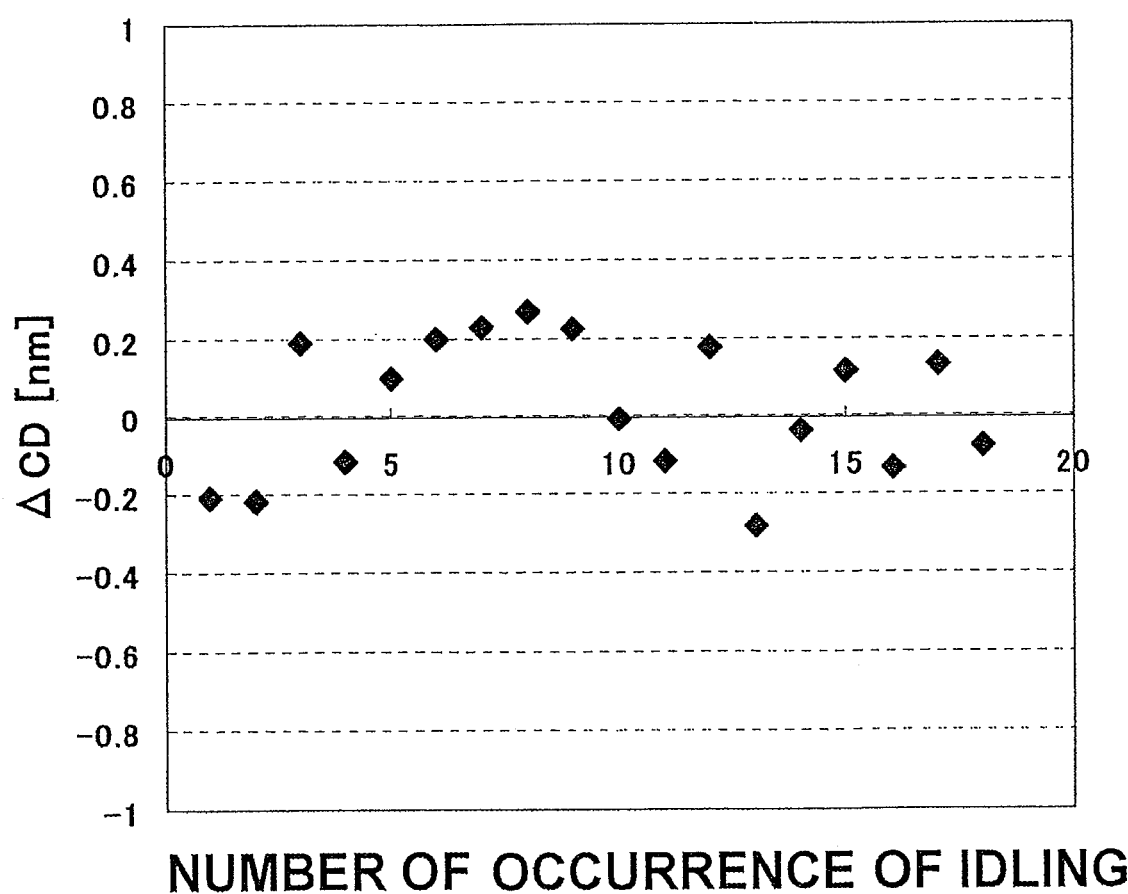
FIG. 10 is a graph illustrating the relationship between the number of occurrence of idling and the $\Delta CD$ at that time when idling has occurred for one minute or longer when the process according to the flowchart of FIG. 8 was applied to mass production processing.

The graph of FIG. 10 is used to describe the relationship between the number of occurrence of idling and the ΔCD at that time when idling has occurred for 1 minute or longer when the process of the flowchart of FIG. 9 is applied to mass production operation. According to the operation conditions, the time of the plasma heating step (S3) is 20 seconds and the plasma cleaning step (S2') after the plasma heating step is 5 seconds. As a result, it was discovered that by using the method of embodiment 2, the operation could be performed with the ΔCD falling within the range of plus or minus 0.3 nm even when idling occurs.

The CD controllability of embodiment 2 is not good compared to the results of embodiment 1, but this depends on the time setting of the plasma heating step (S2'). The time of the plasma heating step should be as short as possible to improve the CD controllability, but at the same time, the increase in the number of plasma cleaning results in the consumption of components within the reactor and the deterioration of throughput, as described earlier. Therefore, it is desirable to control the time of the heating step to an appropriate value corresponding to each product. According to ITRS (International Technology Roadmap for Semiconductors) 2007, for example, the CD dispersion tolerated in gate etching in the year 2012 is 3σ=0.84 nm. Therefore, the present process is operated within the acceptable value of ΔCD=plus or minus 0.3 nm according to the present embodiment. However, in consideration of the CD variation with respect to long-term continuous processing, the CD variation during idling should preferably be smaller.

According to embodiment 2, the plasma heating step after idling is ended when ΔSiF becomes approximately equal to zero. According to the present product being etched, the ΔCD substantially became zero when ΔSiF became approximately equal to zero. However, since the plasma emission has a distribution within the reactor, the temperature rise distribution of reactor components is also varied. Therefore, the emission intensity of SiF varies depending on the observation position in which the emission is extracted, so that there are cases in which the ΔCD does not become when the ΔSiF before and after idling is zero. In such case, for example, it is appropriate to determine the end point of the plasma heating step when αΔSiF+C (C is a constant) is zero, by adopting a correction value having a constant added thereto. This correction may also become necessary in embodiment 1.

As described according to embodiment 2, the end of the heating step after idling can be determined based on the emission intensity during cleaning, without providing a database.

Embodiment 3

Figure 11:
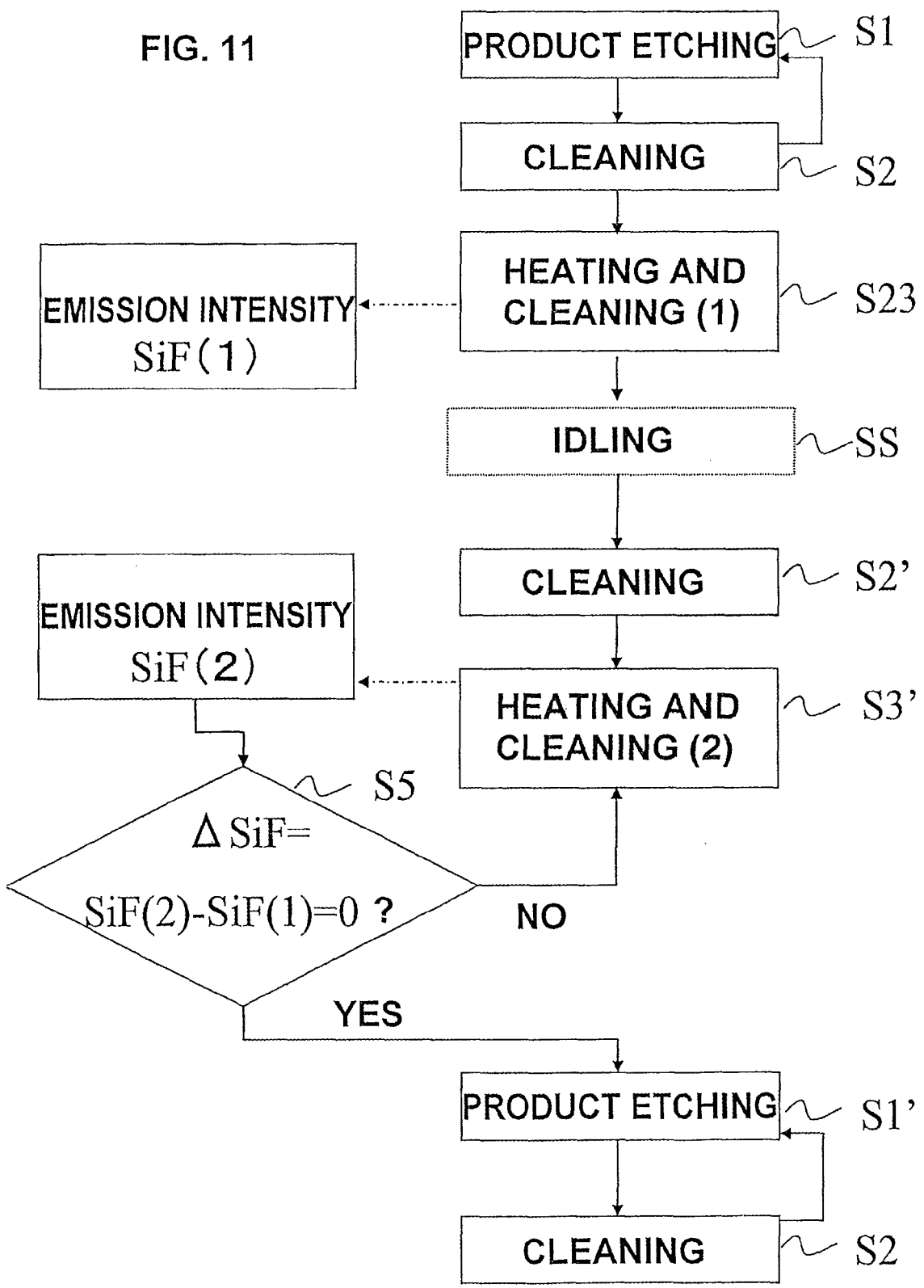
FIG. 11 is a flowchart illustrating the process related to embodiment 3 of the present invention.

A CD control method according to a third embodiment of the present invention will now be described with reference to the flowchart of FIG. 11. In embodiment 3, a plasma heating and plasma cleaning step (1) (S23) is additionally provided after the plasma cleaning step (S2) of FIG. 9 illustrating embodiment 2, and the plasma heating step (S3) of FIG. 9 is replaced with a plasma heating and plasma cleaning step (2) (S3'). The plasma heating and plasma cleaning step (1) (S23) before idling (SS) is not aimed at heating the reactor, but is aimed at obtaining the emission intensity (SiF(1)) for computing ΔSiF together with the emission intensity (SiF(2)) obtained during the plasma heating and plasma cleaning step (2) (S3') after idling. Therefore, the plasma heating and plasma cleaning step must always be performed before idling when the occurrence of idling is predicted based on the processing request status of product etching. Further, the plasma heating and plasma cleaning step (1) (S23) should be performed under the same or similar conditions as the plasma heating and plasma cleaning step (2) (S3') and should preferably perform a short time discharge, for example between one and 60 seconds. Further, if idling time is short and the emission intensity rarely varies with respect to time, such as in the example of FIG. 3 where no residual Si 302 exists, the plasma cleaning step (S2') of the present embodiment may not be necessary.

The gas used for the plasma heating and plasma cleaning step (1) (S23) and the plasma heating and plasma cleaning step (2) (S3') should preferably contain Ar being an inert gas as base and include F-based gas such as $CF_4$, $SF_6$, $NF_3$, $CF_4$, $CHF_3$, $C_4F_6$ and $C_4F_8$. In the plasma heating and plasma cleaning step (2) (S3'), the emission intensity of SiF (SiF(2)) is monitored in real time, and when the ΔSiF substantially becomes zero, the present process is ended.

Figure 12:
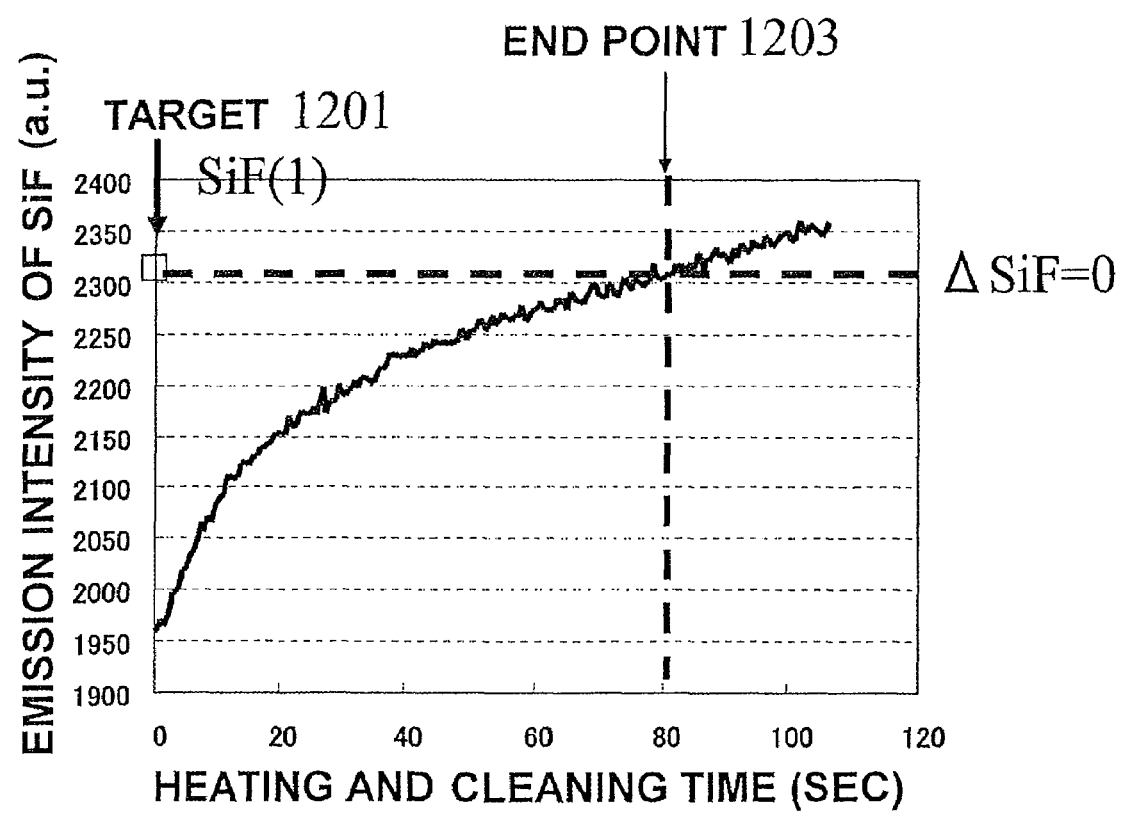
FIG. 12 is a graph illustrating the method of end point determination of the plasma heating and plasma cleaning step (2) of FIG. 11.

An example of end point determination of the plasma heating and plasma cleaning step (2) (S3') will be described with reference to FIG. 12, which is a graph illustrating the method of end point determination. The emission intensity SiF(1) acquired in the plasma heating and plasma cleaning (1) (S23) before entering idling SS is set as the target 1201, and the point where the emission intensity variation 1202 of SiF(2) during the plasma heating and plasma cleaning (2) (S3') performed after idling corresponds to or reaches the target value is set as the end point 1203 of the present step (S5), where in the product etching (S1') is started immediately thereafter.

Also in embodiment 3, similar to embodiment 2, there are cases in which the end point of the heating step should be determined using a correction value having a constant value added thereto, such as αΔSiF+C=0 (C represents constant). Similarly, when utilizing the ratio of emission intensities before and after idling (SiF(2)/SiF(1)=1), there are cases where it is better to use a correction value having a constant value added thereto (SiF(2)/SiF(1)+C=1).

Embodiment 3 enables to provide a method for etching a sample for monitoring in real time the information on the uppermost surface of the reactor during a plasma heating and plasma cleaning process before and after idling after performing product etching, so as to maintain a stable processing profile after idling.

According further to the method for etching a sample of the present invention, a linearity such as ΔCD=αΔSiF+C has been realized, but there may be cases in which other functions should be applied. Therefore, it is appropriate to select for each product a function that corresponds well to the experimental values.

Further according to embodiments 1 through 3 of the present invention, a gas containing at least $CF_4$, $SiF_4$, $SF_6$, $C_4F_8$ or $CHF_3$ gas, or a gas containing at least HCl, $Cl_2$, $CH_2Cl_2$, $SiCl_4$ or $BCl_3$ gas can be used as the gas to be introduced into the processing chamber in the cleaning steps (S2 and S2') before and after idling (SS) or in the plasma heating and plasma cleaning steps (S23 and S3'). Further, the emission species of the emission intensity to be monitored during the cleaning (S2 or S2') or the plasma heating and plasma cleaning steps (S23 and S3') can be selected from any one of SiF, SiCl, Si, O, F, $C_2$, SiCl, Cl, $Cl_2$ and H.

Figure 13:
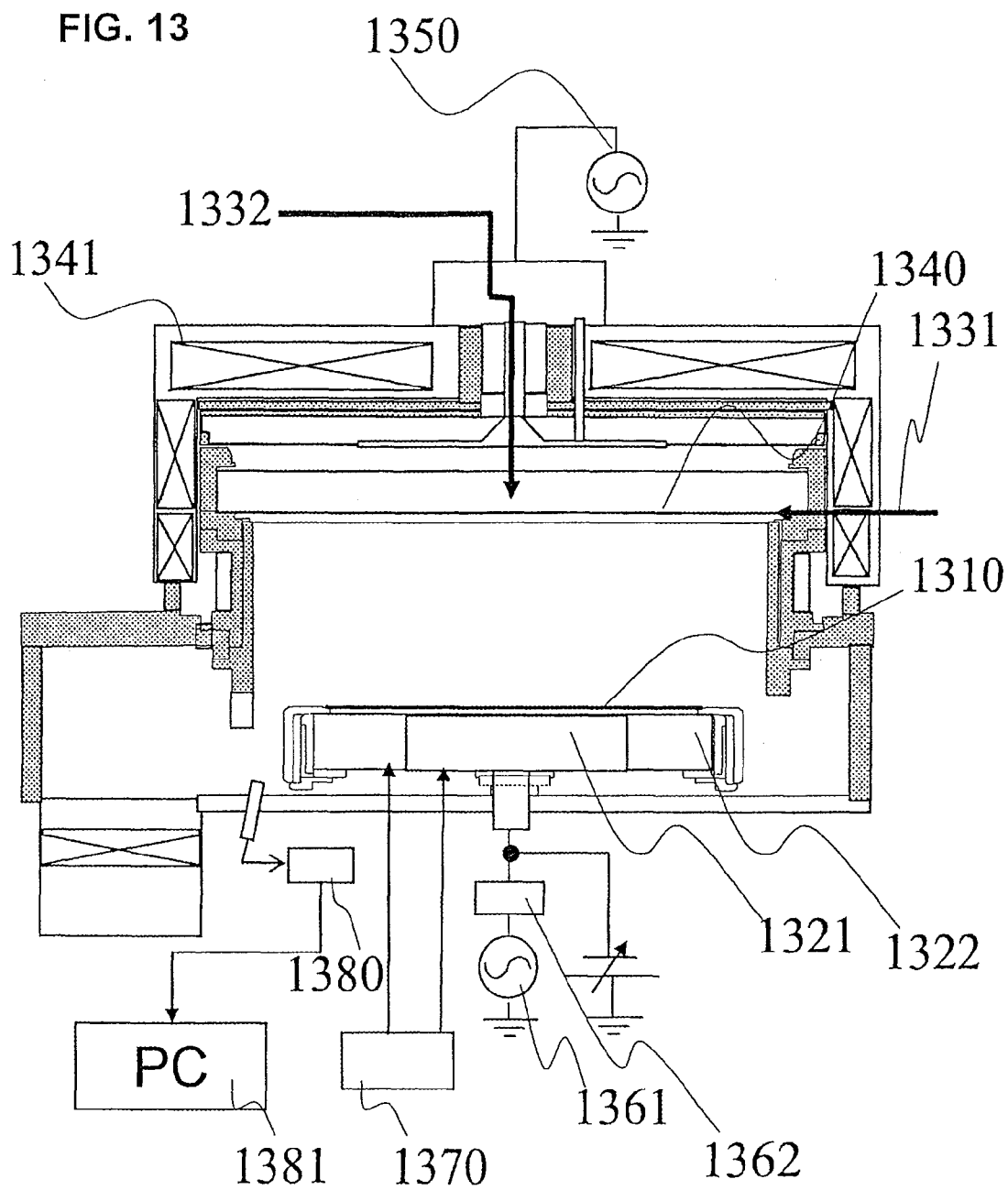
FIG. 13 is a view illustrating the configuration of an etching apparatus to which the present invention is applied.

The etching apparatus illustrated in FIG. 13 can be used as an example of the etching apparatus to which the present invention is applied. The etching apparatus comprises an electrode on which a wafer 1310 is to be placed within a processing chamber, a gas supply port, a shower plate 1340, a solenoid 1341, a high frequency power supply 1350, an RF bias power supply 1361, a matching box 1362, a circulator 1370, an emission spectroscope 1380, and a device (such as a PC) 1381 for storing the emission spectrum and data obtained from the emission spectroscope 1380. An inner electrode 1321 and an outer electrode 1322 are disposed below the processing wafer 1310. The gas supply port is composed of an inner gas supply port 1332 and an outer gas supply port 1331. The control of the temperature and temperature distribution of the wafer stage for mounting the wafer can be performed for example by using multiple refrigerants, by controlling the pressure of He on the rear surface of the wafer, or by using a heater. For example, the etching apparatus illustrated in FIG. 13 has an inner electrode 1321 and an outer electrode 1322 below the wafer 1310.

What is claimed is:

1. A method for plasma processing, using a plasma processing apparatus comprising a vacuum processing reactor constituting a vacuum processing chamber, a gas supply device for supplying processing gas into the vacuum processing reactor, a plasma generating means for dissociating the processing gas supplied via the gas supply device and generating plasma, an emission spectroscope for monitoring the emission of plasma generated via the plasma generating means, and a means for storing the emission spectrum thereof, to perform an etching process of a sample carried into the vacuum processing reactor, wherein the method comprises:

a first cleaning step for plasma cleaning inside the vacuum processing reactor after the etching process of the sample;

an idling of the etching process, wherein during the idling the etching process of the sample is temporarily discontinued;

a second cleaning step for plasma cleaning inside the vacuum processing reactor after the idling; and a heating step for plasma heating the vacuum processing reactor after the idling and before restarting the etching process of the sample, wherein in the heating step, the vacuum processing reactor is plasma heated until a difference between an emission intensity during the first cleaning step and an emission intensity during the second cleaning step becomes substantially zero, or a ratio between an emission intensity during the first cleaning step and an emission intensity during the second cleaning step becomes substantially one.

2. A method for plasma processing, using a plasma processing apparatus comprising a vacuum processing reactor constituting a vacuum processing chamber, a gas supply device for supplying processing gas into the vacuum processing reactor, a plasma generating means for dissociating the processing gas supplied via the gas supply device and generating plasma, an emission spectroscope for monitoring the emission of plasma generated via the plasma generating means, and a means for storing the emission spectrum thereof, to perform an etching process of a sample carried into the vacuum processing reactor, wherein the method comprises:

a first cleaning step for plasma cleaning inside the vacuum processing reactor after the etching process of the sample;

an idling of the etching process, wherein during the idling the etching process of the sample is temporarily discontinued;

a second cleaning step for plasma cleaning inside the vacuum processing reactor after the idling; and a heating step for plasma heating the vacuum processing reactor after the idling and before restarting the etching process of the sample, wherein the second cleaning step and the heating step are repeatedly performed until a difference between an emission intensity during the first cleaning step and an emission intensity during the second cleaning step becomes substantially zero, or a ratio between an emission intensity during the first cleaning step and an emission intensity during the second cleaning step becomes substantially one.

3. The plasma processing method according to claim 1 or 2, wherein gas introduced during the first cleaning step and the second cleaning step contains at least any one of $CF_4$, $SiF_4$, $SF_6$, $C_4F_8$ or $CHF_3$ gas, or contains at least any one of HCl, $Cl_2$, $CH_2Cl_2$, $SiCl_4$ or $BCl_3$ gas.

4. The plasma processing method according to claim 1 or 2, wherein an emission species of the emission intensity to be monitored during the first cleaning step and the second cleaning step is selected from a group consisting of SiF, SiCl, Si, O, F, $O_2$, SiCl, Cl, $Cl_2$ and H.

5. The method for plasma processing according to claim 1 or 2, wherein an emission intensity during the first cleaning step and an emission intensity during the second cleaning step is a value taken at a time of or at a later time than a point where each of the emission intensities no longer shows any time variation.

6. A method for plasma processing, using a plasma processing apparatus comprising a vacuum processing reactor constituting a vacuum processing chamber, a gas supply device for supplying processing gas into the vacuum processing reactor, a plasma generating means for dissociating the processing gas supplied via the gas supply device and generating plasma, an emission spectroscope for monitoring the emission of plasma generated via the plasma generating means, and a means for storing the emission spectrum thereof, to perform an etching process of a sample carried into the vacuum processing reactor, wherein the method comprises:
  a cleaning step for plasma cleaning inside the vacuum processing reactor after the etching process of the sample;
  a first heating and cleaning step for plasma cleaning and plasma heating inside the vacuum processing reactor after the cleaning step; and
  an idling of the etching process, wherein during the idling the etching process of the sample is temporarily discontinued;
  a second heating and cleaning step for plasma cleaning and plasma heating inside the vacuum processing reactor after the idling;
  wherein the second heating and cleaning step is repeatedly performed until a difference between an emission intensity during the first heating and cleaning step and an emission intensity during the second heating and cleaning step becomes substantially zero, or a ratio between an emission intensity during the first heating and cleaning step and an emission intensity during the second heating and cleaning step becomes substantially one.

7. A method for plasma processing, using a plasma processing apparatus comprising a vacuum processing reactor constituting a vacuum processing chamber, a gas supply device for supplying processing gas into the vacuum processing reactor, a plasma generating means for dissociating the processing gas supplied via the gas supply device and generating plasma, an emission spectroscope for monitoring the emission of plasma generated via the plasma generating means, and a means for storing the emission spectrum thereof, to perform an etching process of a sample carried into the vacuum processing reactor, wherein the method comprises:
  a first cleaning step for plasma cleaning inside the vacuum processing reactor after the etching process of the sample;
  an idling of the etching process, wherein during the idling the etching process of the sample is temporarily discontinued;
  a second cleaning step for plasma cleaning inside the vacuum processing reactor after the idling; and
  a heating step for plasma heating the vacuum processing reactor after the idling and before restarting the etching process of the sample,
  wherein in the heating step, the vacuum processing reactor is plasma heated until the value $(\alpha(S2-S1)+C)$, obtained by multiplying a coefficient $\alpha$ to a difference between an emission intensity (S1) during the first cleaning step and an emission intensity (S2) during the second cleaning step and adding a constant C thereto, becomes substantially zero, or the value $(\alpha \times S2/S1+C)$, obtained by multiplying a coefficient $\alpha$ to a ratio between an emission intensity (S1) during the first cleaning step and an emission intensity (S2) during the second cleaning step and adding a constant C thereto, becomes substantially one.

8. A method for plasma processing, using a plasma processing apparatus comprising a vacuum processing reactor constituting a vacuum processing chamber, a gas supply device for supplying processing gas into the vacuum processing reactor, a plasma generating means for dissociating the processing gas supplied via the gas supply device and generating plasma, an emission spectroscope for monitoring the emission of plasma generated via the plasma generating means, and a means for storing the emission spectrum thereof, to perform an etching process of a sample carried into the vacuum processing reactor, wherein the method comprises:
  a first cleaning step for plasma cleaning inside the vacuum processing reactor after the etching process of the sample;
  an idling of the etching process, wherein during the idling the etching process of the sample is temporarily discontinued;
  a second cleaning step for plasma cleaning inside the vacuum processing reactor after the idling; and
  a heating step for plasma heating the vacuum processing reactor after the idling and before restarting the etching process of the sample,
  wherein the second cleaning step and the heating step are repeatedly performed until the value $(\alpha(S2-S1)+C)$, obtained by multiplying a coefficient $\alpha$ to a difference between an emission intensity (Si) during the first cleaning step and an emission intensity (S2) during the second cleaning step and adding a constant C thereto, becomes substantially zero, or the value $(\alpha \times S2/S1+C)$, obtained by multiplying a coefficient $\alpha$ to a ratio between an emission intensity (S1) during the first cleaning step and an emission intensity (S2) during the second cleaning step and adding a constant C thereto, becomes substantially one.

* * * * *